(12) United States Patent
Yu et al.

(10) Patent No.: US 11,417,580 B2
(45) Date of Patent: Aug. 16, 2022

(54) PACKAGE STRUCTURES AND METHODS OF FORMING THE SAME

(71) Applicant: Taiwan Semiconductor Manufacturing Co., Ltd., Hsinchu (TW)

(72) Inventors: Chen-Hua Yu, Hsinchu (TW); Wen-Hsin Wei, Hsinchu (TW); Chi-Hsi Wu, Hsinchu (TW); Shang-Yun Hou, Jubei (TW); Jing-Cheng Lin, Hsinchu (TW); Hsien-Pin Hu, Zhubei (TW); Ying-Ching Shih, Hsinchu (TW); Szu-Wei Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/012,299

(22) Filed: Sep. 4, 2020

(65) Prior Publication Data
US 2020/0402877 A1 Dec. 24, 2020

Related U.S. Application Data

(63) Continuation of application No. 16/215,048, filed on Dec. 10, 2018, now Pat. No. 10,770,365, which is a
(Continued)

(51) Int. Cl.
*H01L 23/31* (2006.01)
*H01L 23/16* (2006.01)
(Continued)

(52) U.S. Cl.
CPC ........ *H01L 23/3114* (2013.01); *H01L 21/486* (2013.01); *H01L 21/561* (2013.01); *H01L 21/563* (2013.01); *H01L 23/147* (2013.01); *H01L 23/16* (2013.01); *H01L 23/481* (2013.01); *H01L 23/49827* (2013.01);
(Continued)

(58) Field of Classification Search
CPC .................................................. H01L 23/3114
See application file for complete search history.

(56) References Cited

U.S. PATENT DOCUMENTS 8,802,504 B1   8/2014   Hou et al.
8,803,292 B2   8/2014   Chen et al.
(Continued)

FOREIGN PATENT DOCUMENTS

CN   102194804 A   9/2011
CN   103681613 A   3/2014
(Continued)

*Primary Examiner* — William A Harriston
(74) *Attorney, Agent, or Firm* — Slater Matsil, LLP

(57) ABSTRACT

An embodiment is a method including: attaching a first die to a first side of a first component using first electrical connectors, attaching a first side of a second die to first side of the first component using second electrical connectors, attaching a dummy die to the first side of the first component in a scribe line region of the first component, adhering a cover structure to a second side of the second die, and singulating the first component and the dummy die to form a package structure.

20 Claims, 21 Drawing Sheets

Related U.S. Application Data continuation of application No. 15/712,987, filed on Sep. 22, 2017, now Pat. No. 10,153,222.

(60) Provisional application No. 62/421,787, filed on Nov. 14, 2016.

(51) Int. Cl.

| | |
|---|---|
| *H01L 21/56* | (2006.01) |
| *H01L 23/14* | (2006.01) |
| *H01L 21/48* | (2006.01) |
| *H01L 25/03* | (2006.01) |
| *H01L 25/065* | (2006.01) |
| *H01L 23/48* | (2006.01) |
| *H01L 23/498* | (2006.01) |
| *H01L 23/538* | (2006.01) |
| *H01L 23/00* | (2006.01) |

(52) U.S. Cl.
CPC ............ *H01L 23/562* (2013.01); *H01L 24/05* (2013.01); *H01L 24/14* (2013.01); *H01L 24/16* (2013.01); *H01L 24/32* (2013.01); *H01L 24/73* (2013.01); *H01L 24/94* (2013.01); *H01L 24/97* (2013.01); *H01L 25/03* (2013.01); *H01L 25/065* (2013.01); *H01L 25/0652* (2013.01); *H01L 25/0655* (2013.01); *H01L 25/0657* (2013.01); *H01L 23/3128* (2013.01); *H01L 23/5389* (2013.01); *H01L 24/13* (2013.01); *H01L 24/29* (2013.01); *H01L 2224/0401* (2013.01); *H01L 2224/13124* (2013.01); *H01L 2224/13144* (2013.01); *H01L 2224/13147* (2013.01); *H01L 2224/13155* (2013.01); *H01L 2224/13164* (2013.01); *H01L 2224/1403* (2013.01); *H01L 2224/14181* (2013.01); *H01L 2224/16145* (2013.01); *H01L 2224/16225* (2013.01); *H01L 2224/16227* (2013.01); *H01L 2224/2919* (2013.01); *H01L 2224/32145* (2013.01); *H01L 2224/32225* (2013.01); *H01L 2224/73204* (2013.01); *H01L 2224/73253* (2013.01); *H01L 2224/81191* (2013.01); *H01L 2224/81192* (2013.01); *H01L 2224/92125* (2013.01); *H01L 2224/92225* (2013.01); *H01L 2224/94* (2013.01); *H01L 2224/97* (2013.01); *H01L 2225/06513* (2013.01); *H01L 2225/06517* (2013.01); *H01L 2225/06541* (2013.01); *H01L 2225/06565* (2013.01); *H01L 2225/06568* (2013.01); *H01L 2225/06586* (2013.01); *H01L 2924/10271* (2013.01); *H01L 2924/1203* (2013.01); *H01L 2924/1304* (2013.01); *H01L 2924/1431* (2013.01); *H01L 2924/1436* (2013.01); *H01L 2924/15311* (2013.01); *H01L 2924/18161* (2013.01); *H01L 2924/3511* (2013.01)

(56) References Cited

U.S. PATENT DOCUMENTS

| | | |
|---|---|---|
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,496,189 B2 | 3/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,478,504 B1 | 10/2016 | Shen et al. |
| 2011/0193229 A1* | 8/2011 | Ma .................. H01L 25/0657 257/738 |
| 2011/0215470 A1 | 9/2011 | Chen et al. |
| 2013/0119552 A1 | 5/2013 | Lin et al. |
| 2014/0070423 A1 | 3/2014 | Woychik et al. |
| 2015/0279431 A1* | 10/2015 | Li .......................... G11C 7/04 365/51 |
| 2015/0311182 A1 | 10/2015 | Lee et al. |
| 2015/0318267 A1* | 11/2015 | Yu .................... H01L 21/02274 257/774 |
| 2015/0357256 A1 | 12/2015 | Suthiwongsunthorn et al. |
| 2015/0380276 A1 | 12/2015 | Shin et al. |
| 2017/0229436 A1 | 8/2017 | Yu et al. |
| 2018/0012851 A1 | 1/2018 | Liu et al. |
| 2018/0138151 A1 | 5/2018 | Shih et al. |
| 2018/0240809 A1 | 7/2018 | Kim et al. |
| 2018/0308824 A1 | 10/2018 | Hsiao et al. |

FOREIGN PATENT DOCUMENTS

| | | |
|---|---|---|
| CN | 105006456 A | 10/2015 |
| CN | 106033751 A | 10/2016 |
| KR | 20150015617 A | 2/2015 |
| KR | 20150053952 A | 5/2015 |
| KR | 20150059963 A | 6/2015 |
| KR | 20160029648 A | 3/2016 |
| TW | 201314848 A | 4/2013 |
| TW | 201322319 A | 6/2013 |

\* cited by examiner

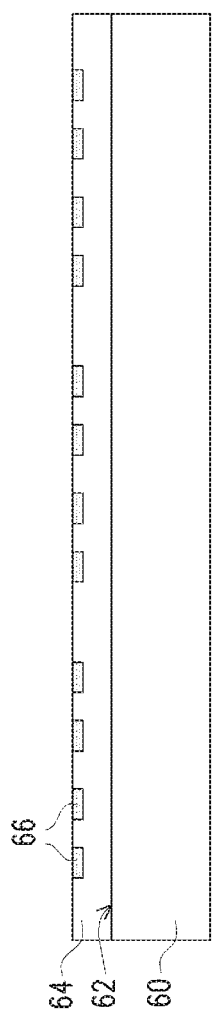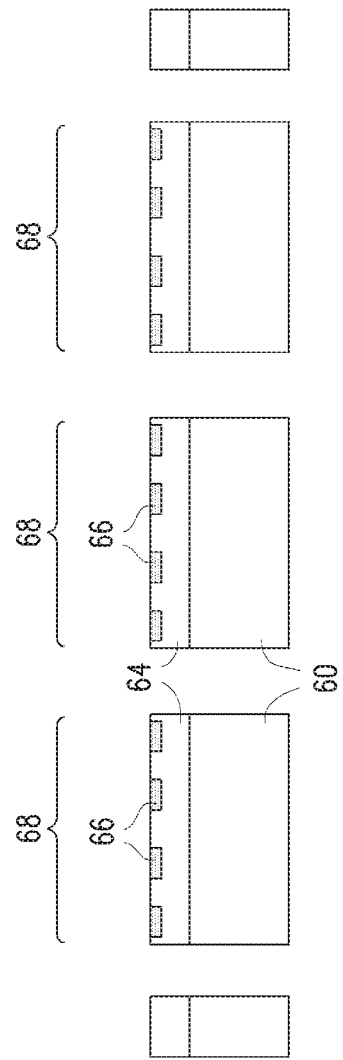

PACKAGE STRUCTURES AND METHODS OF FORMING THE SAME

PRIORITY CLAIM AND CROSS-REFERENCE

This application is a continuation of U.S. patent application Ser. No. 16/215,048, filed on Dec. 10, 2018, entitled "Package Structures and Methods of Forming the Same", which is a continuation of U.S. patent application Ser. No. 15/712,987, filed on Sep. 22, 2017, now U.S. Pat. No. 10,153,222, entitled "Package Structures and Methods of Forming the Same", which claims the benefit of U.S. Provisional Application No. 62/421,787, filed on Nov. 14, 2016, which applications are hereby incorporated herein by reference.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip directly onto a substrate. Interposers have been used to redistribute ball contact areas from that of the chip to a larger area of the interposer. Further, interposers have allowed for a three-dimensional (3D) package that includes multiple chips. Other packages have also been developed to incorporate 3D aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 15 are cross-sectional views and plan views in an example process of forming a package structure in accordance with some embodiments.

DETAILED DESCRIPTION

Figure 3:
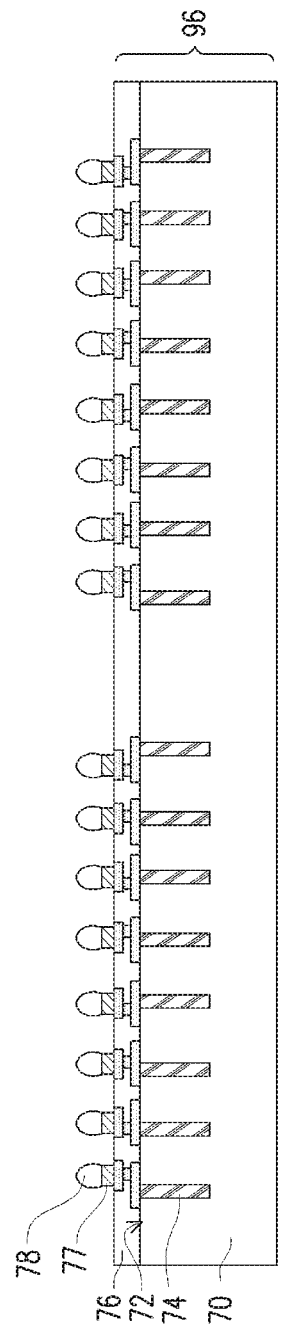

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure including dummy die structures adjacent the active dies to reduce the warpage of the package structure. This reduction of the warpage of the package structure enables a more reliable package structure by reducing the likelihood of cold joints between the active dies and the interposer. In some embodiments, the dummy dies are in the scribe line regions and cover structures are covering some of the active dies while other active dies are not covered by cover structures. The dummy dies may allow for more control of the ratio of the encapsulant and thus may reduce the stress and warpage from the coefficient of thermal expansion (CTE) mismatch. In some embodiments, the encapsulant can be omitted as the dummy dies in the scribe line regions and/or the cover structures provide sufficient support and protection for the package structure. In some embodiments, the active dies are stacks of one or more dies (logic die stacks and/or memory die stacks) with the topmost die of the die stacks being thicker than the other dies of the die stacks. In these embodiments, the dummy dies in the scribe line regions and the encapsulant can be omitted as thicker top dies of the die stacks provide sufficient support and protection for the package structure.

Embodiments will be described with respect to a specific context, namely a Die-Interposer-Substrate stacked package using Chip-on-Wafer-on-Substrate (CoWoS) processing. Other embodiments may also be applied, however, to other packages, such as a Die-Die-Substrate stacked package, and other processing. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

FIG. 1 generically illustrates the formation of one or more die 68. A substrate 60 comprises one or more die 68 during processing. The substrate 60 in an embodiment is a wafer and may comprise a bulk semiconductor substrate, semiconductor-on-insulator (SOI) substrate, multi-layered semiconductor substrate, or the like. The semiconductor material of the substrate 60 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 60 may be doped or undoped. Devices, such as transistors, capacitors, resistors, diodes, and the like, may be formed in and/or on an active surface 62 of the substrate 60.

An interconnect structure 64 comprising one or more dielectric layer(s) and respective metallization pattern(s) is formed on the active surface 62. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like. Additionally, die connectors 66, such as conductive pillars (for example, comprising a metal such as copper), are formed in and/or on the interconnect structure 64 to provide an external electrical connection to the circuitry and devices. In some embodiments, the die connectors 66 protrude from the interconnect structure 64 to form pillar structure to be utilized when bonding the dies 68 to other structures. One of ordinary skill in the art will appreciate that the above examples are provided for illustrative purposes. Other circuitry may be used as appropriate for a given application.

More particularly, an inter-metallization dielectric (IMD) layer may be formed in the interconnect structure 64. The IMD layer may be formed, for example, of a low-K dielectric material, such as phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), plasma-enhanced CVD (PECVD), high-density plasma chemical vapor deposition (HDP-CVD), or the like. A metallization pattern may be formed in the IMD layer, for example, by using photolithography techniques to deposit and pattern a photoresist material on the IMD layer to expose portions of the IMD layer that are to become the metallization pattern. An etch process, such as an anisotropic dry etch process, may be used to create recesses and/or openings in the IMD layer corresponding to the exposed portions of the IMD layer. The recesses and/or openings may be lined with a diffusion barrier layer and filled with a conductive material. The diffusion barrier layer may comprise one or more layers of TaN, Ta, TiN, Ti, CoW, or the like, deposited by atomic layer deposition (ALD), or the like, and the conductive material may comprise copper, aluminum, tungsten, silver, and combinations thereof, or the like, deposited by CVD, physical vapor deposition (PVD), or the like. Any excessive diffusion barrier layer and/or conductive material on the IMD layer may be removed, such as by using a chemical mechanical polish (CMP).

In FIG. 2, the substrate 60 including the interconnect structure 64 is singulated into individual dies 68. Typically, the dies 68 contain the same circuitry, such as devices and metallization patterns, although the dies may have different circuitry. The singulation may be by sawing, dicing, or the like.

The dies 68 may be logic dies (e.g., central processing unit, graphics processing unit, system-on-a-chip, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the dies 68 may be different sizes (e.g., different heights and/or surface areas), and in other embodiments, the dies 68 may be the same size (e.g., same heights and/or surface areas).

Figure 14:
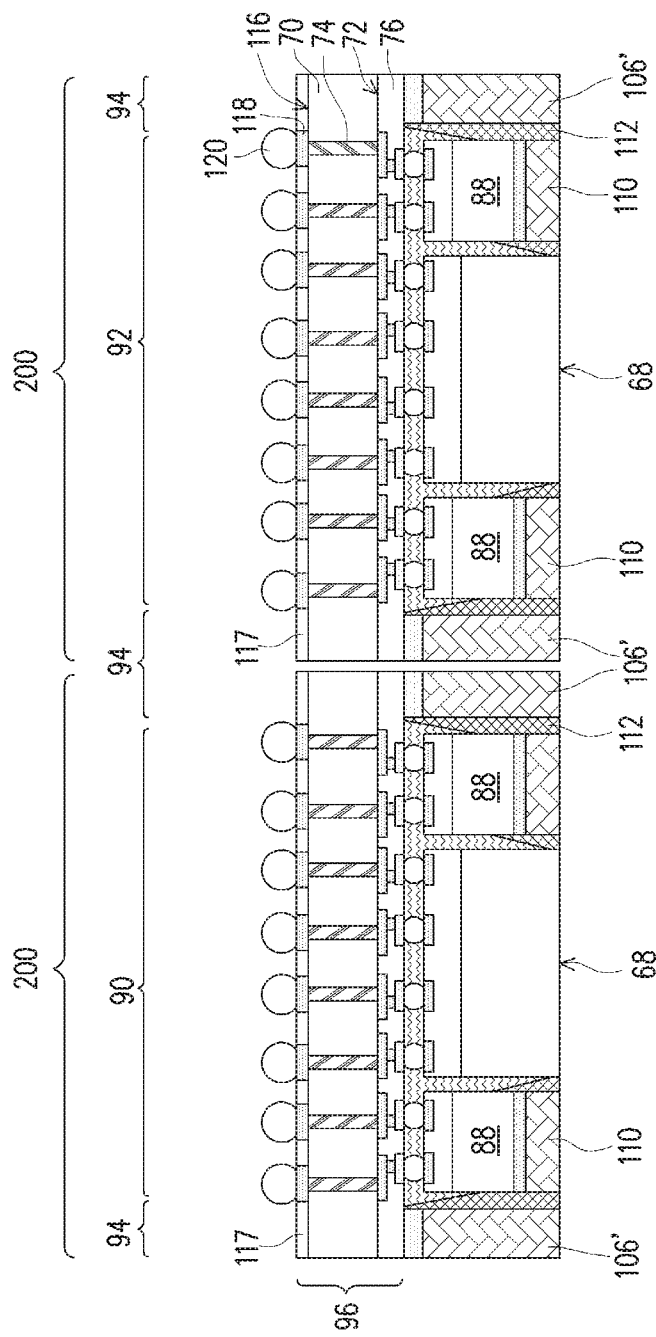

FIG. 3 illustrates the formation of a first side of one or more components 96. As illustrated in FIG. 14, one or more components 96 may be formed from the substrate 70. The components 96 may be an interposer or another die. The substrate 70 can be a wafer. The substrate 70 may comprise a bulk semiconductor substrate, SOI substrate, multi-layered semiconductor substrate, or the like. The semiconductor material of the substrate 70 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 70 may be doped or undoped. Devices, such as transistors, capacitors, resistors, diodes, and the like, may be formed in and/or on a first surface 72, which may also be referred to as an active surface, of the substrate 70. In embodiments where the components 96 are interposers, the components 96 will generally not include active devices therein, although the interposer may include passive devices formed in and/or on a first surface 72 and/or in redistribution structure 76.

Through-vias (TVs) 74 are formed to extend from the first surface 72 of substrate 70 into substrate 70. The TVs 74 are also sometimes referred to as through-substrate vias or through-silicon vias when substrate 70 is a silicon substrate. The TVs 74 may be formed by forming recesses in the substrate 70 by, for example, etching, milling, laser techniques, a combination thereof, and/or the like. A thin dielectric material may be formed in the recesses, such as by using an oxidation technique. A thin barrier layer may be conformally deposited over the front side of the substrate 70 and in the openings, such as by CVD, ALD, PVD, thermal oxidation, a combination thereof, and/or the like. The barrier layer may comprise a nitride or an oxynitride, such as titanium nitride, titanium oxynitride, tantalum nitride, tantalum oxynitride, tungsten nitride, a combination thereof, and/or the like. A conductive material may be deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from the front side of the substrate 70 by, for example, CMP. Thus, the TVs 74 may comprise a conductive material and a thin barrier layer between the conductive material and the substrate 70.

Redistribution structure 76 is formed over the first surface 72 of the substrate 70, and is used to electrically connect the integrated circuit devices, if any, and/or TVs 74 together and/or to external devices. The redistribution structure 76 may include one or more dielectric layer(s) and respective metallization pattern(s) in the dielectric layer(s). The metallization patterns may comprise vias and/or traces to interconnect any devices and/or TVs 74 together and/or to an external device. The metallization patterns are sometimes referred to as Redistribution Lines (RDL). The dielectric layers may comprise silicon oxide, silicon nitride, silicon carbide, silicon oxynitride, low-K dielectric material, such as PSG, BPSG, FSG, $SiO_xC_y$, Spin-On-Glass, Spin-On-Polymers, silicon carbon material, compounds thereof, composites thereof, combinations thereof, or the like. The dielectric layers may be deposited by any suitable method known in the art, such as spinning, CVD, PECVD, HDP-CVD, or the like. A metallization pattern may be formed in the dielectric layer, for example, by using photolithography techniques to deposit and pattern a photoresist material on the dielectric layer to expose portions of the dielectric layer that are to become the metallization pattern. An etch process, such as an anisotropic dry etch process, may be used to create recesses and/or openings in the dielectric layer corresponding to the exposed portions of the dielectric layer. The recesses and/or openings may be lined with a diffusion barrier layer and filled with a conductive material. The diffusion barrier layer may comprise one or more layers of TaN, Ta, TiN, Ti, CoW, or the like, deposited by ALD, or the like, and the conductive material may comprise copper, aluminum, tungsten, silver, and combinations thereof, or the like, deposited by CVD, PVD, or the like. Any excessive diffusion barrier layer and/or conductive material on the dielectric layer may be removed, such as by using a CMP.

Electrical connectors 77/78 are formed at the top surface of the redistribution structure 76 on conductive pads. In some embodiments, the conductive pads include under bump metallurgies (UBMs). In the illustrated embodiment, the pads are formed in openings of the dielectric layers of the redistribution structure 76. In another embodiment, the pads (UBMs) can extend through an opening of a dielectric layer of the redistribution structure 76 and also extend across the top surface of the redistribution structure 76. As an example to form the pads, a seed layer (not shown) is formed at least in the opening in the dielectric layer of the redistribution structure 76. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads. In the embodiment, where the pads are formed differently, more photo resist and patterning steps may be utilized.

In some embodiments, the electrical connectors 77/78 include a metal pillar 77 with a metal cap layer 78, which may be a solder cap 78, over the metal pillar 77. The electrical connectors 77/78 including the pillar 77 and the cap layer 78 are sometimes referred to as micro bumps 77/78. In some embodiments, the metal pillars 77 include a conductive material such as copper, aluminum, gold, nickel, palladium, the like, or a combination thereof and may be formed by sputtering, printing, electro plating, electroless plating, CVD, or the like. The metal pillars 77 may be solder free and have substantially vertical sidewalls. In some embodiments, a metal cap layer 78 is formed on the top of the metal pillar 77. The metal cap layer 78 may include nickel, tin, tin-lead, gold, copper, silver, palladium, indium, nickel-palladium-gold, nickel-gold, the like, or a combination thereof and may be formed by a plating process.

In another embodiment, the electrical connectors 77/78 do not include the metal pillars and are solder balls and/or bumps, such as controlled collapse chip connection (C4), electroless nickel immersion Gold (ENIG), electroless nickel electroless palladium immersion gold technique (EN-EPIG) formed bumps, or the like. In this embodiment, the bump electrical connectors 77/78 may include a conductive material such as solder, copper, aluminum, gold, nickel, silver, palladium, tin, the like, or a combination thereof. In this embodiment, the electrical connectors 77/78 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes.

Figure 4:
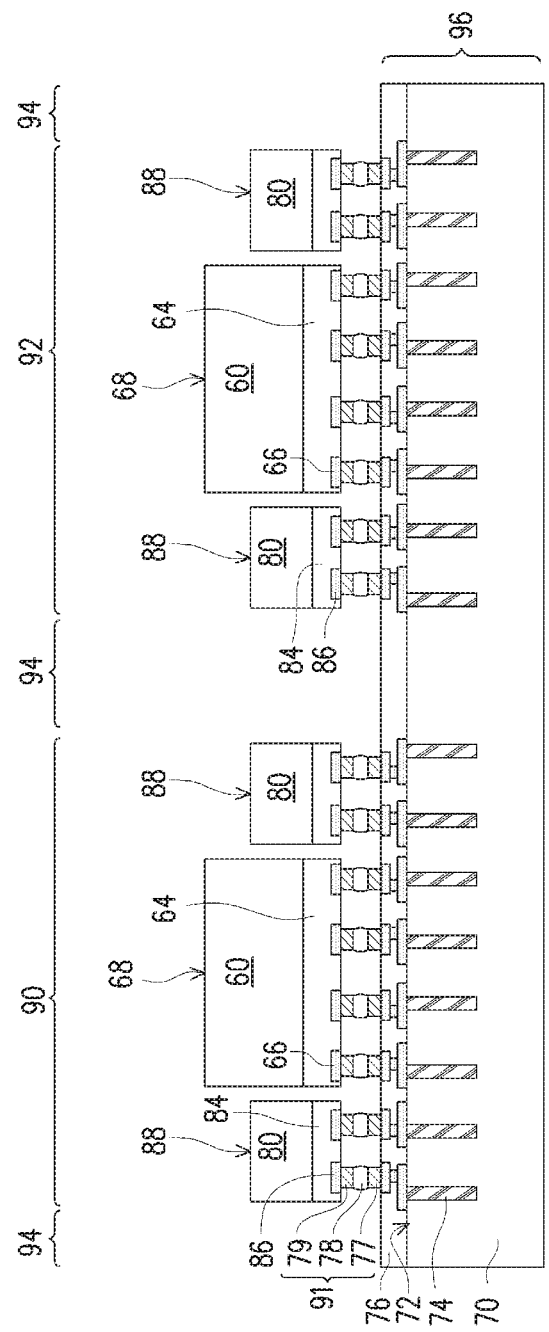

In FIG. 4, the dies 68 and the dies 88 are attached to the first side of the components 96, for example, through flip-chip bonding by way of the electrical connectors 77/78 and the metal pillars 79 on the dies to form conductive joints 91. The metal pillars 79 may be similar to the metal pillars 77 and the description is not repeated herein. The dies 68 and the dies 88 may be placed on the electrical connectors 77/78 using, for example, a pick-and-place tool. In some embodiments, the metal cap layers 78 are formed on the metal pillars 77 (as shown in FIG. 3), the metal pillars 79 of the dies 68 and the dies 88, or both.

The dies 88 may be formed through similar processing as described above in reference to the dies 68. In some embodiments, the dies 88 include one or more memory dies, such as a stack of memory dies (e.g., DRAM dies, SRAM dies, High-Bandwidth Memory (HBM) dies, Hybrid Memory Cubes (HMC) dies, or the like). In the stack of memory dies embodiments, a die 88 can include both memory dies and a memory controller, such as, for example, a stack of four or eight memory dies with a memory controller. Also, in some embodiments, the dies 88 may be different sizes (e.g., different heights and/or surface areas), and in other embodiments, the dies 88 may be the same size (e.g., same heights and/or surface areas).

The dies 88 include a main body 80, an interconnect structure 84, and die connectors 86. The main body 80 of the dies 88 may comprise any number of dies, substrates, transistors, active devices, passive devices, or the like. In an embodiment, the main body 80 may include a bulk semiconductor substrate, semiconductor-on-insulator (SOI) substrate, multi-layered semiconductor substrate, or the like. The semiconductor material of the main body 80 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The main body 80 may be doped or undoped. Devices, such as transistors, capacitors, resistors, diodes, and the like, may be formed in and/or on an active surface.

An interconnect structure 84 comprising one or more dielectric layer(s) and respective metallization pattern(s) is formed on the active surface. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like. Additionally, die connectors 86, such as conductive pillars (for example, comprising a metal such as copper), are formed in and/or on the interconnect structure 84 to provide an external electrical connection to the circuitry and devices. In some embodiments, the die connectors 86 protrude from the interconnect structure 84 to form pillar structure to be utilized when bonding the dies 88 to other structures. One of ordinary skill in the art will appreciate that the above examples are provided for illustrative purposes. Other circuitry may be used as appropriate for a given application.

More particularly, an IMD layer may be formed in the interconnect structure 64. The IMD layer may be formed, for example, of a low-K dielectric material, such as PSG, BPSG, FSG, $SiO_xC_y$, Spin-On-Glass, Spin-On-Polymers, silicon carbon material, compounds thereof, composites thereof, combinations thereof, or the like, by any suitable method known in the art, such as spinning, CVD, PECVD, HDP-CVD, or the like. A metallization pattern may be formed in the IMD layer, for example, by using photolithography techniques to deposit and pattern a photoresist material on the IMD layer to expose portions of the IMD layer that are to become the metallization pattern. An etch process, such as an anisotropic dry etch process, may be used to create recesses and/or openings in the IMD layer corresponding to the exposed portions of the IMD layer. The recesses and/or openings may be lined with a diffusion barrier layer and filled with a conductive material. The diffusion barrier layer may comprise one or more layers of tantalum nitride, tantalum, titanium nitride, titanium, cobalt tungsten, the like, or a combination thereof, deposited by ALD, or the like. The conductive material of the metallization patterns may comprise copper, aluminum, tungsten, silver, and combinations thereof, or the like, deposited by CVD, PVD, or the like. Any excessive diffusion barrier layer and/or conductive material on the IMD layer may be removed, such as by using a CMP.

In the embodiments wherein the die connectors 66 and 86 protrude from the interconnect structures 64 and 84, respectively, the metal pillars 79 may be excluded from the dies 68 and 88 as the protruding die connectors 66 and 86 may be used as the pillars for the metal cap layers 78.

The conductive joints 91 electrically couple the circuits in the dies 68 and the dies 88 through interconnect structures 84 and 64 and die connectors 86 and 66, respectively, to redistribution structure 76 and TVs 74 in components 96.

In some embodiments, before bonding the electrical connectors 77/78, the electrical connectors 77/78 are coated with a flux (not shown), such as a no-clean flux. The electrical connectors 77/78 may be dipped in the flux or the flux may be jetted onto the electrical connectors 77/78. In another embodiment, the flux may be applied to the electrical connectors 79/78. In some embodiments, the electrical connectors 77/78 and/79/78 may have an epoxy flux (not shown) formed thereon before they are reflowed with at least some of the epoxy portion of the epoxy flux remaining after the dies 68 and the dies 88 are attached to the components 96. This remaining epoxy portion may act as an underfill to reduce stress and protect the joints resulting from the reflowing the electrical connectors 77/78/79.

The bonding between the dies 68 and 88 and the components 96 may be a solder bonding or a direct metal-to-metal (such as a copper-to-copper or tin-to-tin) bonding. In an embodiment, the dies 68 and the dies 88 are bonded to the components 96 by a reflow process. During this reflow process, the electrical connectors 77/78/79 are in contact with the die connectors 66 and 86, respectively, and the pads of the redistribution structure 76 to physically and electrically couple the dies 68 and the dies 88 to the components 96. After the bonding process, an IMC (not shown) may form at the interface of the metal pillars 77 and 79 and the metal cap layers 78.

In FIG. 4 and subsequent figures, a first package region 90 and a second package region 92 for the formation of a first package and a second package, respectively, are illustrated. Scribe line regions 94 are between adjacent package regions. As illustrated in FIG. 4, a die 68 and multiple dies 88 are attached in each of the first package region 90 and the second package region 92.

In some embodiments, the dies 68 are system-on-a-chip (SoC) or a graphics processing unit (GPU) and the second dies are memory dies that may utilized by the dies 68. In an embodiment, the dies 88 are stacked memory dies. For example, the stacked memory dies 88 may include low-power (LP) double data rate (DDR) memory modules, such as LPDDR1, LPDDR2, LPDDR3, LPDDR4, or the like memory modules.

Figure 5:
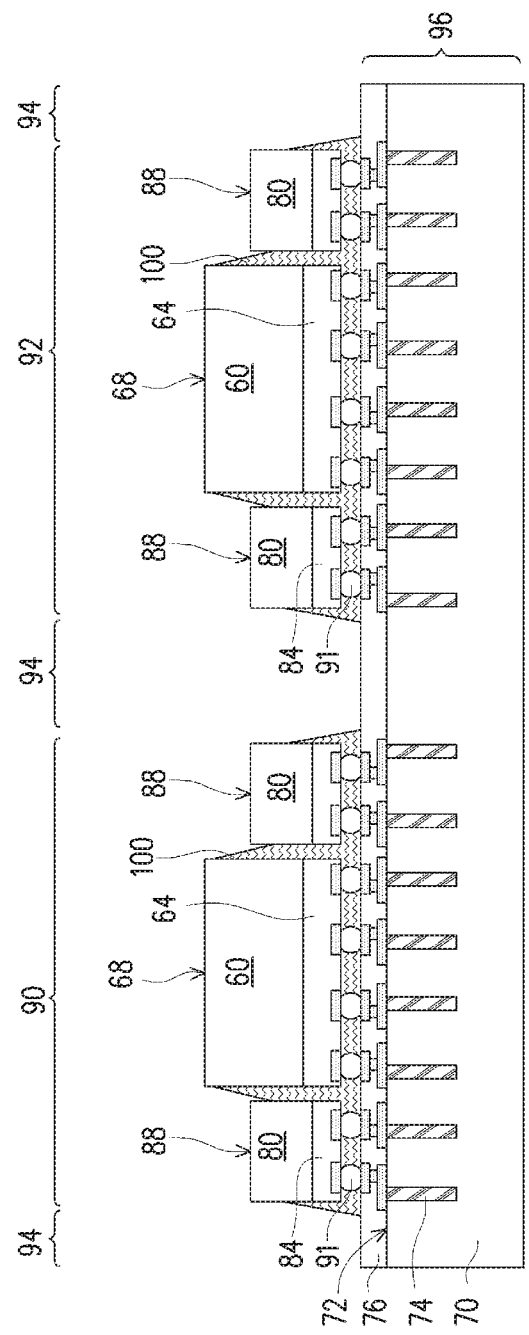

In FIG. 5, an underfill material 100 is dispensed into the gaps between the dies 68, the dies 88, the redistribution structure 76, and surrounding the conductive joints 91. In FIG. 5 and subsequent Figures, the illustration of each of the conductive joints 91 is shown as including a single structure, but as illustrated in FIG. 4, each of the conductive joints 91 can include two metal pillars 77 and 79 with a metal layer 78 therebetween. The underfill material 100 may extend up along sidewall of the dies 68 and the dies 88. The underfill material 100 may be any acceptable material, such as a polymer, epoxy, molding underfill, or the like. The underfill material 100 may be formed by a capillary flow process after the dies 68 and 88 are attached, or may be formed by a suitable deposition method before the dies 68 and 88 are attached.

Figure 6A:
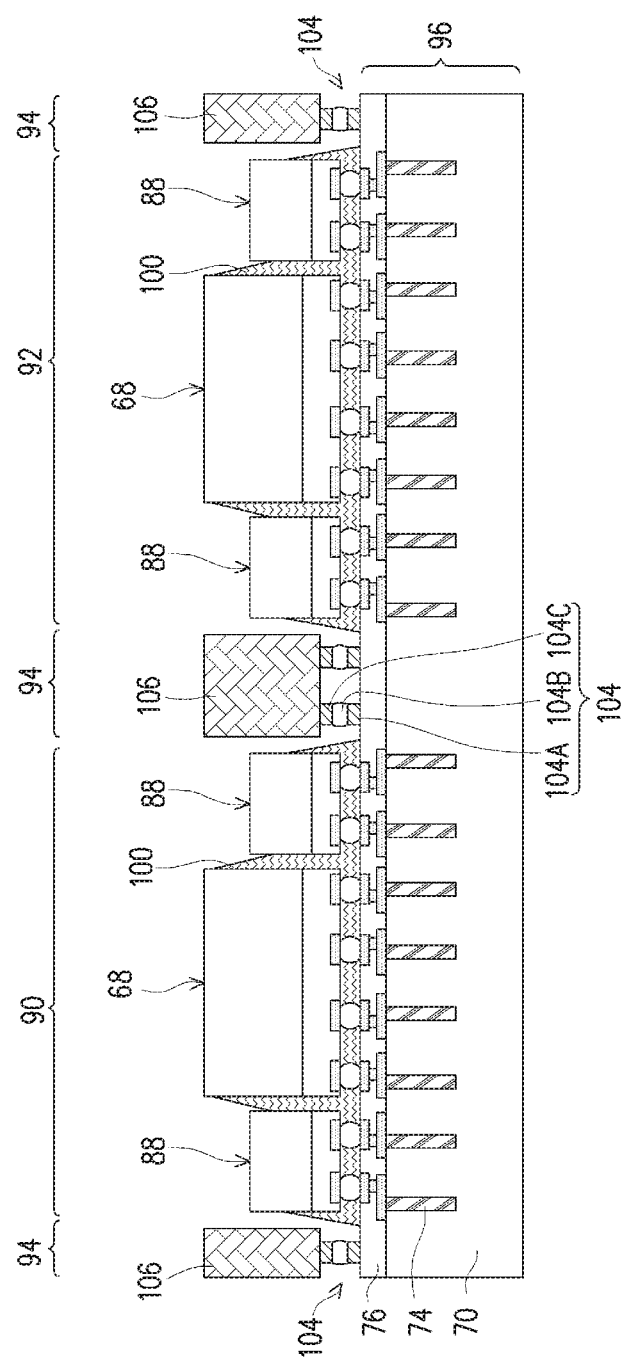
Figure 6B:
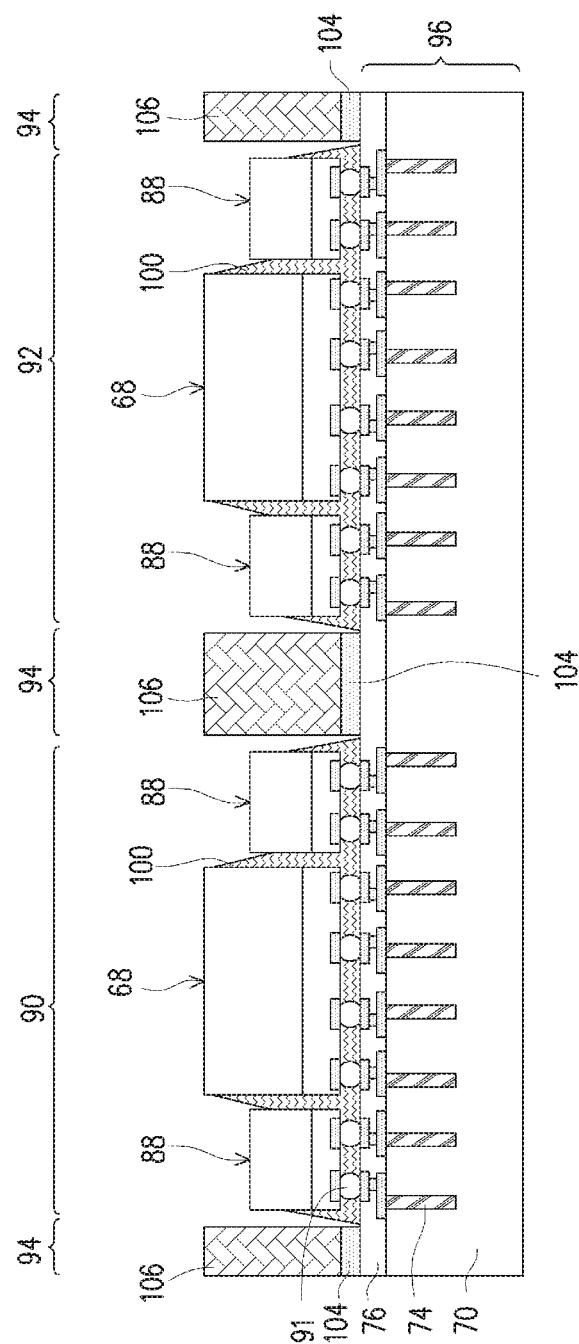

In FIGS. 6A and 6B, dummy dies 106 are adhered in the scribe line regions 94 adjacent the dies 88 with an attaching structure 104. FIGS. 6A and 6B illustrate two embodiments for the attaching structure 104. The dummy dies 106 being placed in the scribe line regions 94 can help to prevent warpage during and after singulation (see FIG. 14) of the packages in the first and second package regions 90 and 92. One way the dummy dies 106 can help to reduce warpage is to provide support to the package during the actual singulation process. Another way that the dummy dies 106 can prevent warpage is to reduce the coefficient of thermal expansion (CTE) mismatch between the components 96 and the subsequently formed encapsulant 112, if present, (see FIG. 8) as the dummy dies 106 have a similar CTE to the components 96 and they reduce the amount of encapsulant 112 necessary in the package.

The dummy dies 106 are attached to the components 96 with the attaching structure 104. In some embodiments, the attaching structure 104 is one or more micro bumps that bond the dummy dies 106 to the components. In some embodiments, the attaching structure 104 is an adhesive that adheres the dummy dies 106 to the components 96. The dummy dies 106 may be made of silicon, a dielectric material, the like, or a combination thereof. In some embodiments, the dummy dies 106 are actually defective active dies that have been recycled as dummy dies 106. In some embodiments, the dummy dies 106 are bulk material and do not include any active or passive devices. In some embodiments, the top surfaces of the dummy dies 106 are level with the back sides of the dies 68.

In FIG. 6A, the micro bump attaching structure 104 embodiment is illustrated. In this embodiment, the micro bumps 104 are formed on bottom surfaces of the dummy dies 106, the top surfaces of the components 96, or both. The micro bumps 104 can be formed at a same time as micro bumps (e.g. electrical connectors 77/78/79) that bond the dies 68 and 88. In particular, the structures 104A, 104B, and 104C of the attaching structure 104 can be the same as the structures 77, 78, and 79, respectively, and the description of these structures is not repeated herein. The micro bumps 104 bond the dummy dies 106 to the components 96, such as the redistribution structure 76 in the illustration. The micro bumps 104 of the dummy dies 106 can be reflowed together with the electrical connectors 77/78/79 of the dies 68 and 88. The dummy dies 106 may be placed on the micro bumps 104 by using, for example, a pick-and-place tool. The underfill material 100 can be cured before or after the dummy dies 106 are bonded.

In FIG. 6B, the adhesive attaching structure 104 embodiment is illustrated. In this embodiment, the adhesive 104 is on bottom surfaces of the dummy dies 106 and adheres the dummy dies 106 to the components 96, such as the redistribution structure 76 in the illustration. The adhesive 104 may be any suitable adhesive, epoxy, die attach film (DAF), or the like. The adhesive 104 may be applied to a bottom surface of the dummy dies 106 or may be applied over the surface of the redistribution structure 76. The dummy dies 106 may be adhered to the redistribution structure 76 by the adhesive 104 using, for example, a pick-and-place tool. The underfill material 100 can be cured before or after the dummy dies 106 are adhered.

Figure 7:
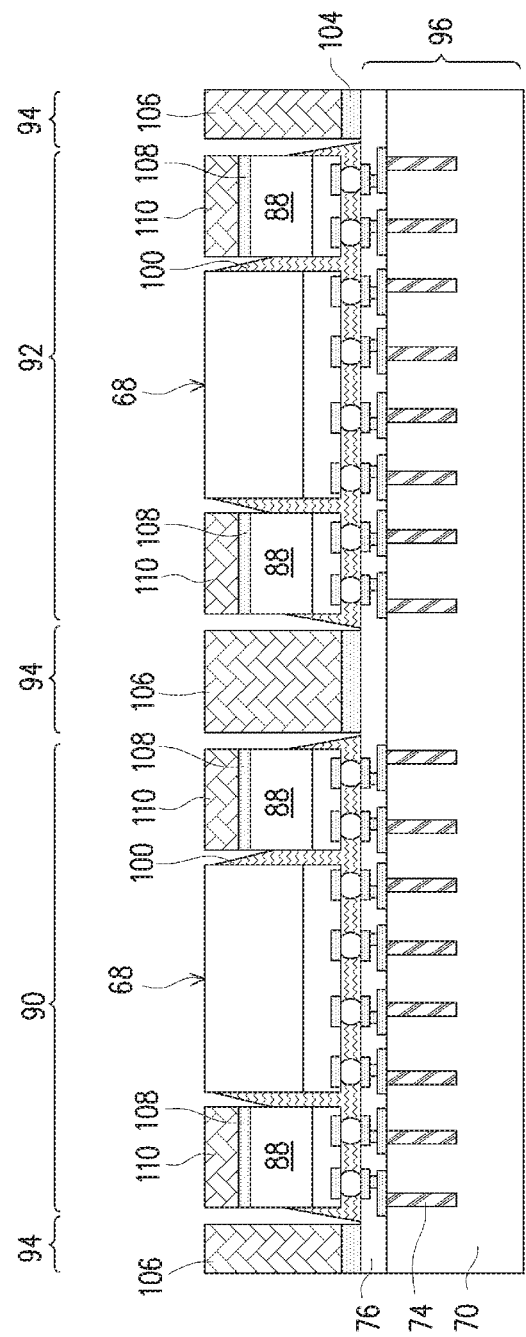

In FIG. 7, cover structures 110 are adhered on back sides of the dies 88. The cover structures 110 significantly reduce the stress on the dies 88 and can protect the dies 88 during subsequent processing. In some embodiments, the dies 88 include a stack of one or more memory dies and the cover structures 110 are thicker than each of the one or more memory dies of the dies 88. In some embodiments, the cover structures 110 have a thickness measured in direction perpendicular to a major surface of the substrate 70 in a range from about 50 µm to about 200 µm, such as about 100 µm.

In some embodiments, the top surfaces of the cover structures 110 are level with the back sides of the dies 68 and the top surfaces of the dummy dies 106. In some embodiments, the cover structures 110 are adhered with an adhesive 108. The cover structures 110 may be made of silicon, a dielectric material, the like, or a combination thereof. The cover structures 110 may comprise the same material as the dummy dies 106. In some embodiments, the cover structures 110 are actually defective active dies that have been recycled as cover structures 110. In some embodiments, the cover structures 110 are bulk material and do not include any active or passive devices. Adhesive 108 is on bottom surfaces of the cover structures 110 and adheres the cover structures 110 to the dies 88. The adhesive 108 may be any suitable adhesive, epoxy, DAF, or the like. The cover structures 110 may be adhered to the dies 88 by the adhesive 108 using, for example, a pick-and-place tool.

Figure 8:
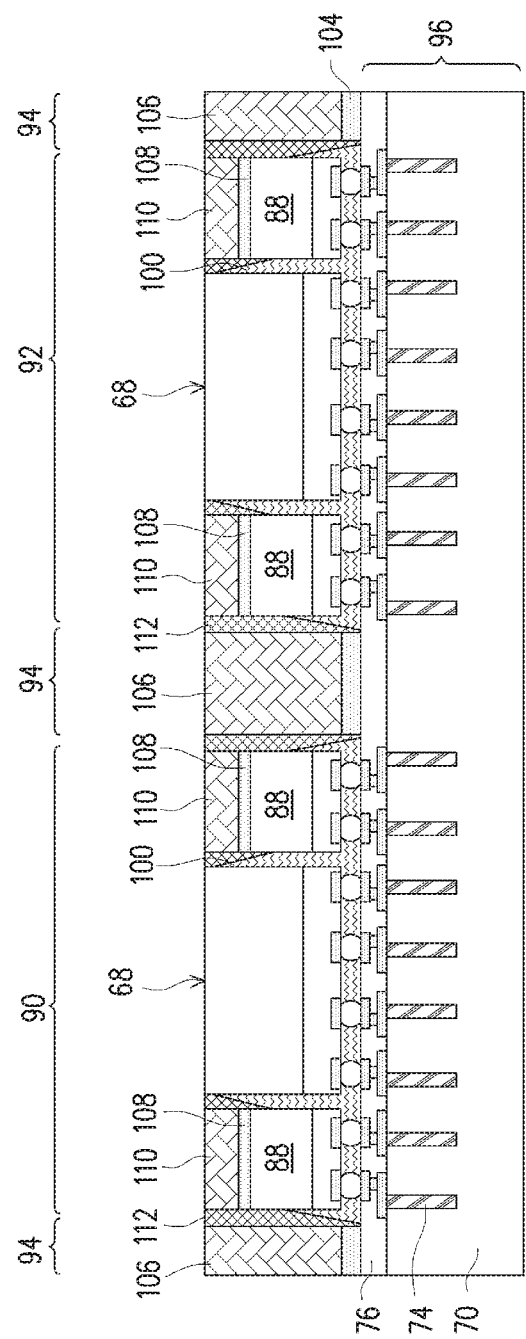

In FIG. 8, an encapsulant 112 is formed on the various components. The encapsulant 112 may be a molding compound, epoxy, or the like, and may be applied by compression molding, transfer molding, or the like. A curing step is performed to cure the encapsulant 112, wherein the curing may be a thermal curing, a Ultra-Violet (UV) curing, or the like. In some embodiments, the dies 68, the dummy dies 106, and/or the cover structures 110 are buried in the encapsulant 112, and after the curing of the encapsulant 112, a planarization step, such as a grinding, may be performed to remove excess portions of the encapsulant 112, which excess portions are over top surfaces of dies 68, dummy dies 106, and/or cover structures 110. Accordingly, top surfaces of dies 68, dummy dies 106, and/or the cover structures 110 are exposed, and are level with a top surface of the encapsulant 112.

Figure 9:
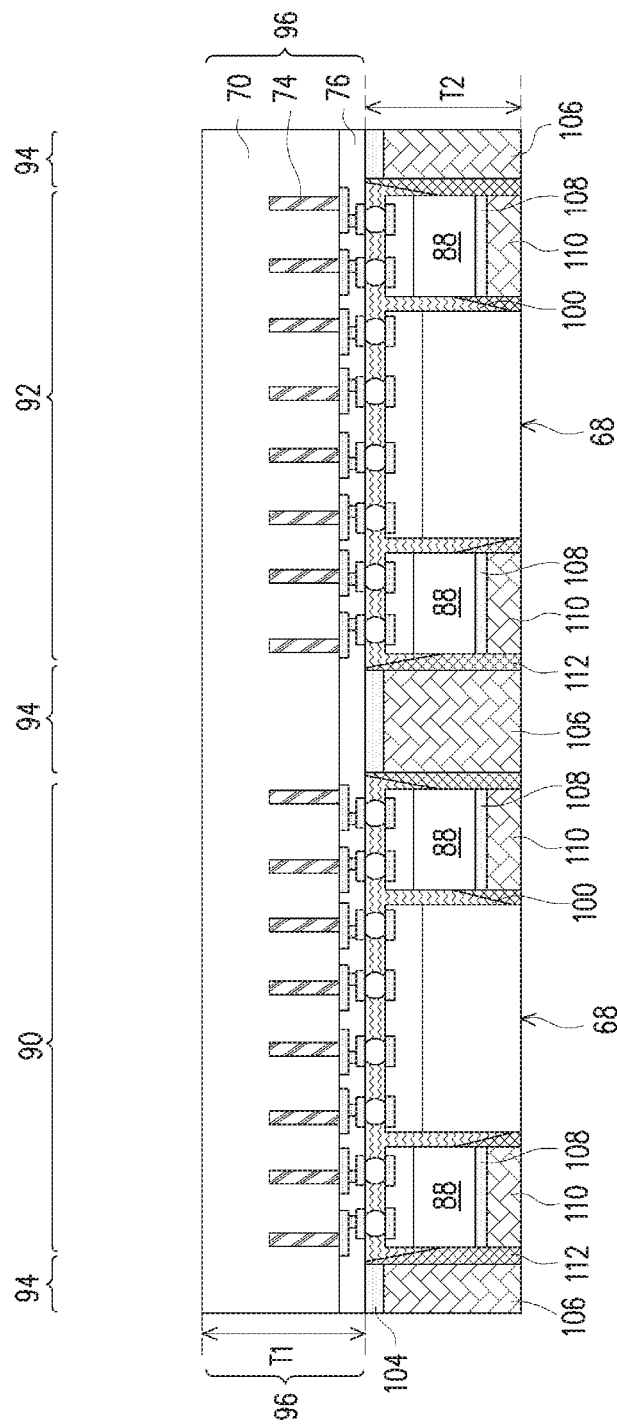

FIGS. 9 through 12 illustrate the formation of the second side of components 96. In FIG. 9, the structure of FIG. 8 is flipped over to prepare for the formation of the second side of components 96. Although not shown, the structure may be placed on a carrier or support structure for the process of FIGS. 9 through 12. As shown in FIG. 9, at this stage of processing, the substrate 70 and redistribution structure 76 of the components 96 have a combined thickness T1 in a range from about 750 µm to about 800 µm, such as about 775 µm. The dummy dies 106 (including attaching structure 104) have a thickness T2 in a range from about 750 µm to about 800 µm, such as about 760 µm. In some embodiments, one or both of the dies 68 and 88 (including conductive joints 91 and cover structures 110 for dies 88) have the thickness T2.

Figure 10:
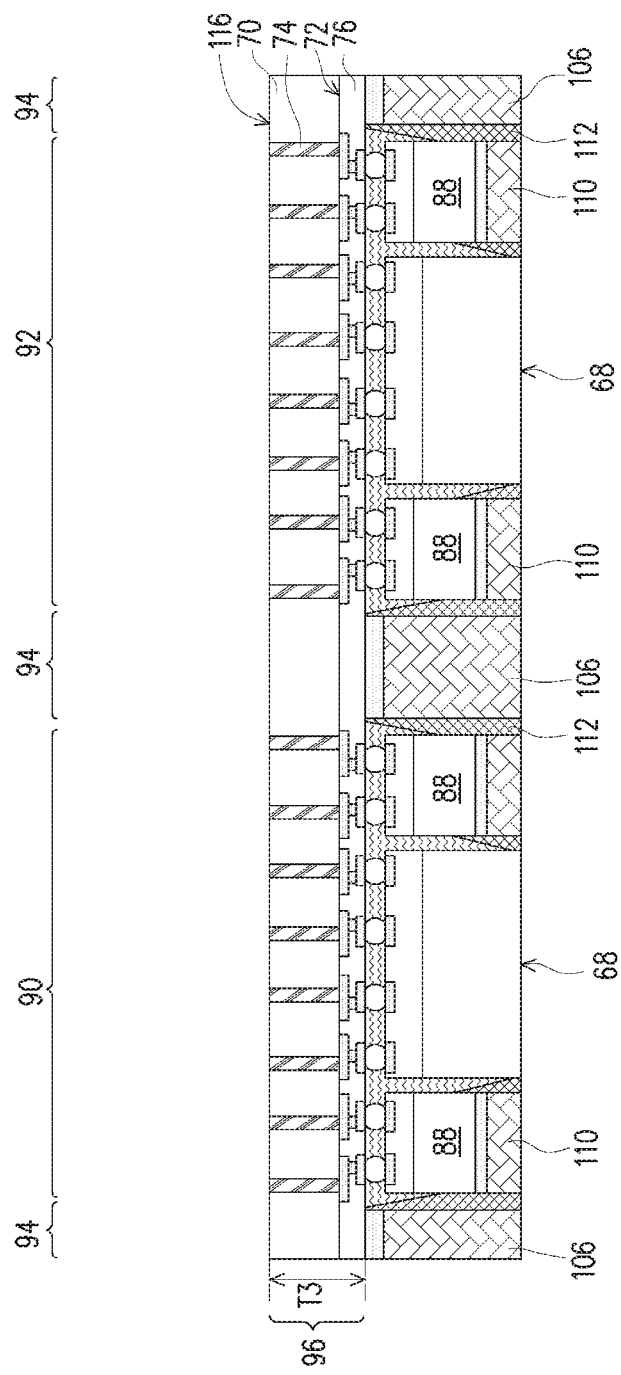

In FIG. 10, a thinning process is performed on the second side of the substrate 70 to thin the substrate 70 to a second surface 116 until TVs 74 are exposed. The thinning process may include an etching process, a grinding process, the like, or a combination thereof. In some embodiments, after the thinning process, the substrate 70 and redistribution structure 76 of the components 96 have a combined thickness T3 in a range from about 20 µm to about 180 µm, such as about 100 µm.

Figure 11:
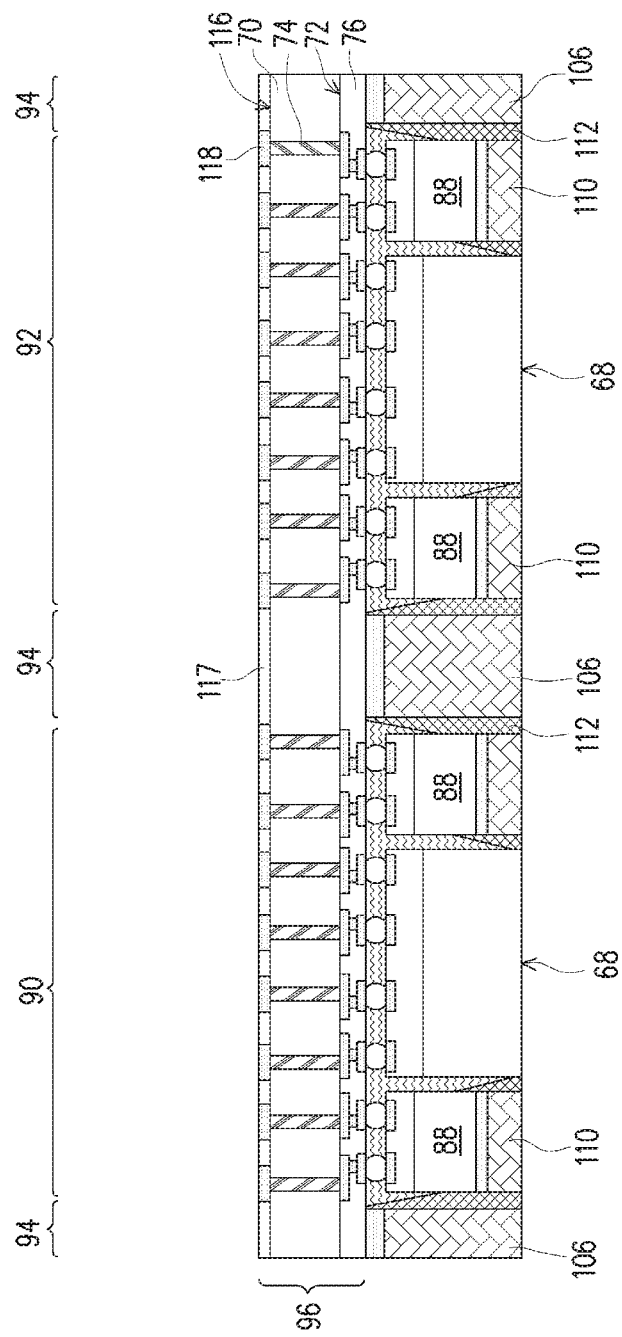

In FIG. 11, a redistribution structure is formed on the second surface 116 of the substrate 70, and is used to electrically connect the TVs 74 together and/or to external devices. The redistribution structure includes one or more dielectric layers 117 and metallization patterns 118 in the one or more dielectric layers 117. The metallization patterns may comprise vias and/or traces to interconnect TVs 74 together and/or to an external device. The metallization patterns 118 are sometimes referred to as Redistribution Lines (RDLs). The dielectric layers 117 may comprise silicon oxide, silicon nitride, silicon carbide, silicon oxynitride, low-K dielectric material, such as PSG, BPSG, FSG, $SiO_xC_y$, Spin-On-Glass, Spin-On-Polymers, silicon carbon material, compounds thereof, composites thereof, combinations thereof, or the like. The dielectric layers 117 may be deposited by any suitable method known in the art, such as spinning, CVD, PECVD, HDP-CVD, or the like. The metallization patterns 118 may be formed in the dielectric layer 117, for example, by using photolithography techniques to deposit and pattern a photoresist material on the dielectric layer 117 to expose portions of the dielectric layer 117 that are to become the metallization pattern 118. An etch process, such as an anisotropic dry etch process, may be used to create recesses and/or openings in the dielectric layer 117 corresponding to the exposed portions of the dielectric layer 117. The recesses and/or openings may be lined with a diffusion barrier layer and filled with a conductive material. The diffusion barrier layer may comprise one or more layers of TaN, Ta, TiN, Ti, CoW, or the like, deposited by ALD, or the like, and the conductive material may comprise copper, aluminum, tungsten, silver, and combinations thereof, or the like, deposited by CVD, PVC, or the like. Any excessive diffusion barrier layer and/or conductive material on the dielectric layer may be removed, such as by using a CMP.

Figure 12:
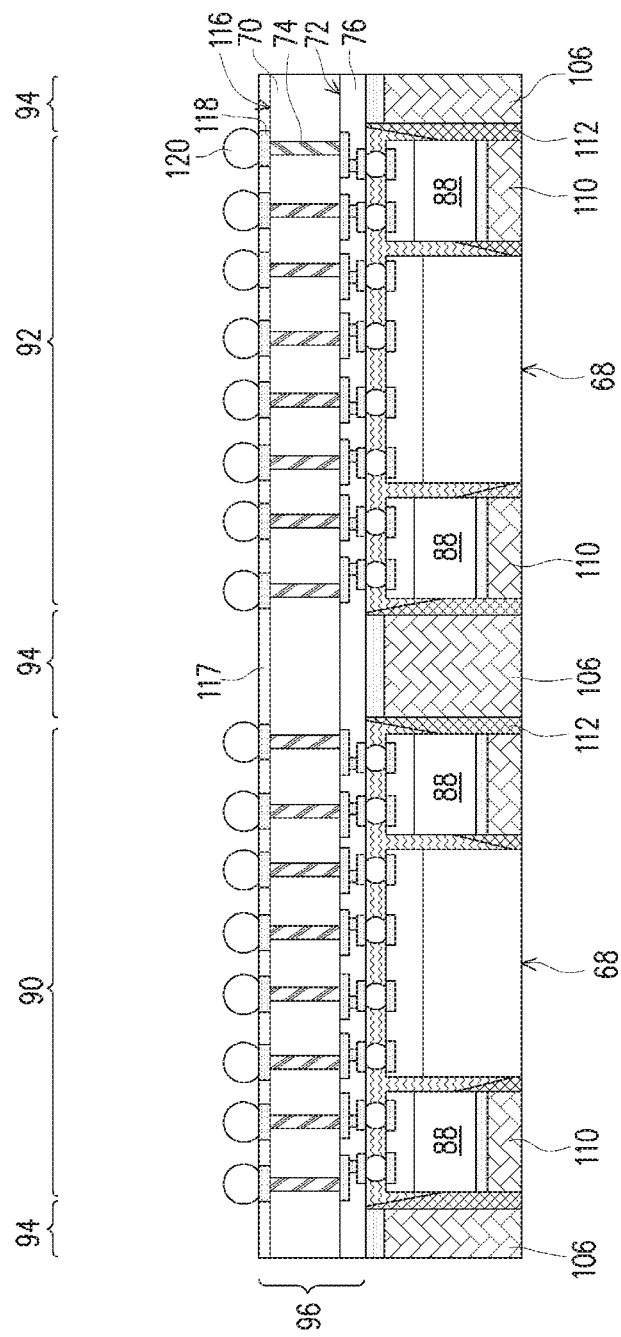

In FIG. 12, electrical connectors 120 are also formed the metallization patterns 118 and are electrically coupled to TVs 74. The electrical connectors 120 are formed at the top surface of the redistribution structure on the metallization patterns 118. In some embodiments, the metallization patterns 118 include UBMs. In the illustrated embodiment, the pads are formed in openings of the dielectric layers 117 of the redistribution structure. In another embodiment, the pads (UBMs) can extend through an opening of a dielectric layer 117 of the redistribution structure and also extend across the top surface of the redistribution structure.

As an example to form the pads, a seed layer (not shown) is formed at least in the opening in one of the dielectric layer 117 of the redistribution structure. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads. In the embodiment, where the pads are formed differently, more photo resist and patterning steps may be utilized.

In some embodiments, the electrical connectors 120 are solder balls and/or bumps, such as ball grid array (BGA) balls, C4 micro bumps, ENIG formed bumps, ENEPIG formed bumps, or the like. The electrical connectors 120 may include a conductive material such as solder, copper, aluminum, gold, nickel, silver, palladium, tin, the like, or a combination thereof. In some embodiments, the electrical connectors 120 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the electrical connectors 120 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 120. The metal cap layer may include nickel, tin, tin-lead, gold, silver, palladium, indium, nickel-palladium-gold, nickel-gold, the like, or a combination thereof and may be formed by a plating process.

Figure 15:
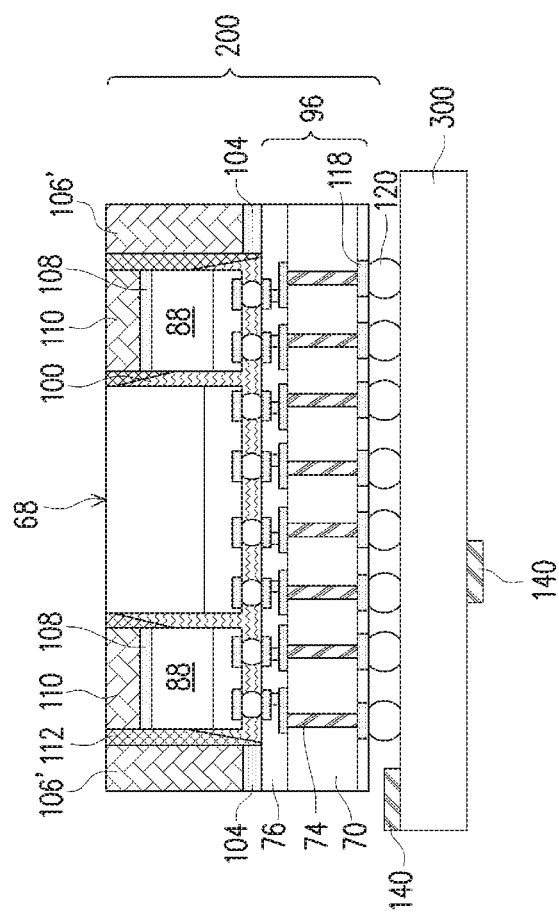

The electrical connectors 120 may be used to bond to an additional electrical component, which may be a semiconductor substrate, a package substrate, a Printed Circuit Board (PCB), or the like (see 300 in FIG. 15).

Figure 13:
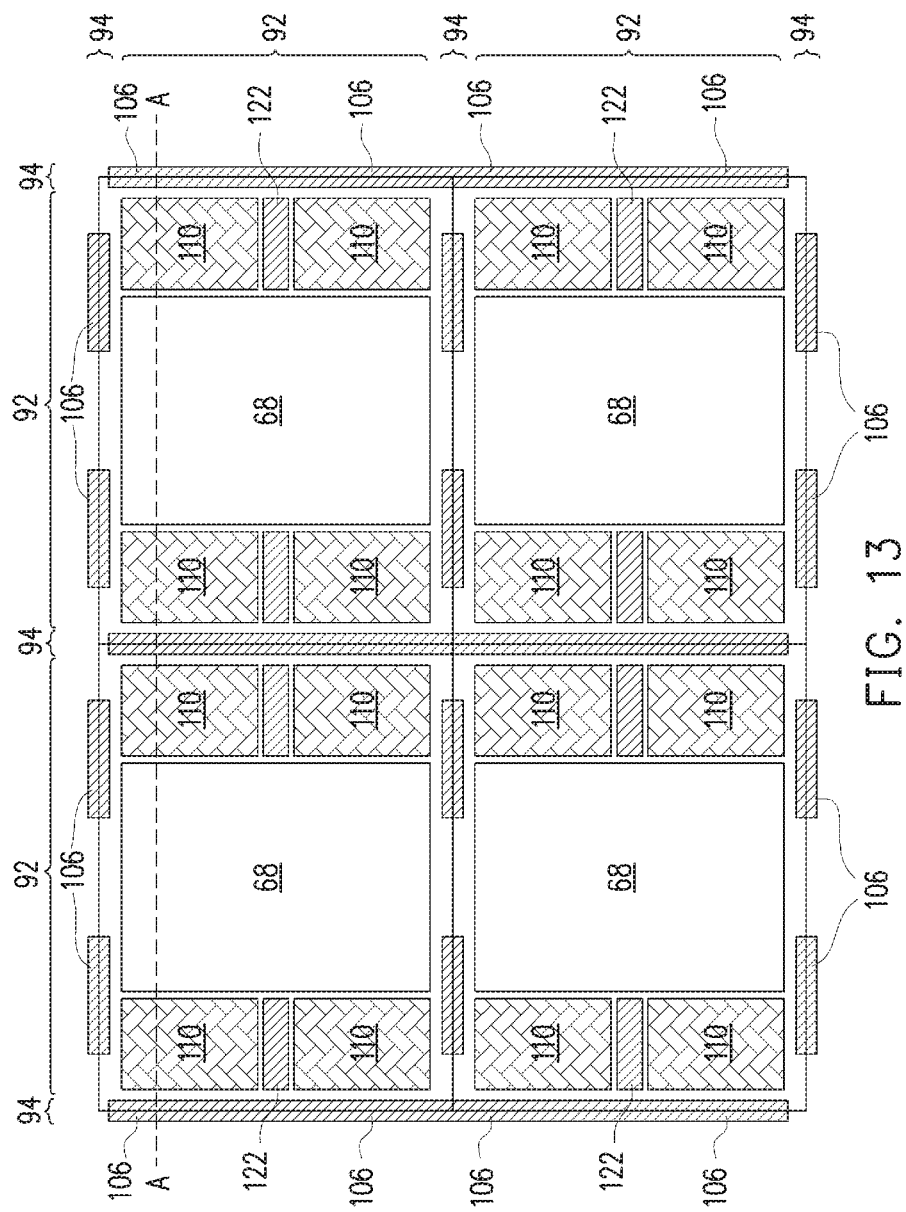

FIG. 13 illustrates a plan view of the package structure in FIG. 12. FIG. 12 is a cross-sectional view along the line A-A in FIG. 13. As illustrated in FIG. 13, the dummy dies 106 are along the scribe line regions 94 surrounding each of the package regions 90 and 92.

In some embodiments, the dummy dies 106 are attached in the scribe line regions 94 and extend only along the scribe line regions 94 that are along a first direction (e.g. vertical direction of FIG. 13). In some embodiments, the package structures can have more than two dies 88 (e.g., can have four dies 88) and the package structure can have more dummy dies 122 interposed between adjacent dies 88 of the same region 90 and/or 92. The dummy dies 122 are similar to the dummy dies 106 and the description is not repeated herein.

Further, in some embodiments, the dummy dies 106 are attached in the scribe line regions 94 and extend along the scribe line regions 94 that are along a first direction and second direction (e.g. both vertical and horizontal directions of FIG. 13) and also interposed between adjacent dies 88 of the same region 90 and/or 92.

Although FIG. 13 shows four regions of the wafer to form four package structures after singulation, the disclosure is not limited to this amount of regions and package structures. In other embodiments, the disclosure could include more or less regions and package structures.

In FIG. 14, components 96 and dummy dies 106 are singulated between adjacent regions 90 and 92 along scribe line regions 94 to form component packages 200 comprising, among other things, a die 68, a component 96, dies 88, cover structures 110, and portions 106' of the dummy dies 106. The singulation may be by sawing, dicing, or the like. As discussed above, the dummy dies 106 help to reduce the stress and warpage caused during and after the singulation process.

After the singulation process, the remaining portions 106' of the dummy dies 106 have sidewall surfaces that are coterminous with the lateral extents of the component package 200 (see, e.g., FIGS. 14 and 15).

FIG. 15 illustrates the attachment of a component package 200 on a substrate 300. Electrical connectors 120 are aligned to, and are put against, bond pads of the substrate 300. The electrical connectors 120 may be reflowed to create a bond between the substrate 300 and the component 96. The substrate 300 may comprise a package substrate, such as a build-up substrate including a core therein, a laminate substrate including a plurality of laminated dielectric films, a PCB, or the like. The substrate 300 may comprise electrical connectors (not shown), such as solder balls, opposite the component package to allow the substrate 300 to be mounted to another device. An underfill material (not shown) can be dispensed between the component package 200 and the substrate 300 and surrounding the electrical connectors 120. The underfill material may be any acceptable material, such as a polymer, epoxy, molding underfill, or the like.

Additionally, one or more surface devices 140 may be connected to the substrate 300. The surface devices 140 may be used to provide additional functionality or programming to the component package 200, or the package as a whole. In an embodiment, the surface devices 140 may include surface mount devices (SMDs) or integrated passive devices (IPDs) that include passive devices such as resistors, inductors, capacitors, jumpers, combinations of these, or the like that are desired to be connected to and utilized in conjunction with component package 200, or other parts of the package. The surface devices 140 may be placed on a first major surface of the substrate 300, an opposing major surface of the substrate 300, or both, according to various embodiments.

Figure 16:
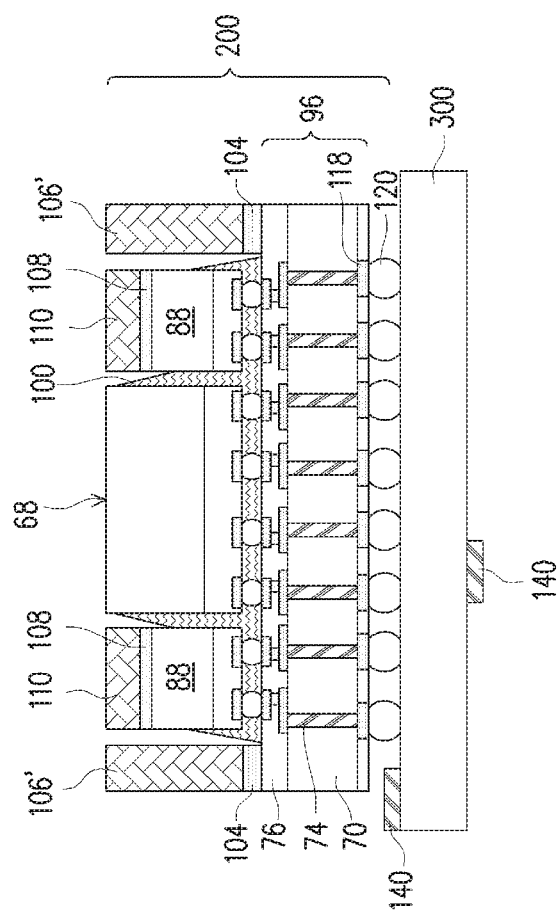
FIG. 16 illustrates a cross-sectional view of a package structure in accordance with some embodiments.

FIG. 16 illustrates a cross-sectional view of a package structure in accordance with some embodiments. The embodiment in FIG. 16 is similar to the embodiment in FIGS. 1 through 15 except that FIG. 16 does not include encapsulant 112. The dummy dies 106 and cover structures 110 may provide sufficient stress reduction and protection such that the encapsulant can be omitted. Details of this embodiment that are the same or similar to the prior embodiment are not repeated herein.

Figure 17:
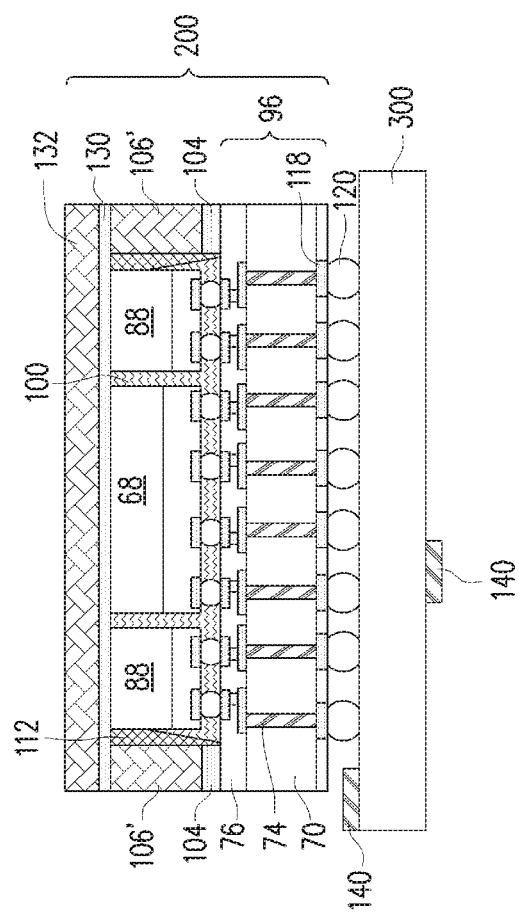
FIG. 17 illustrates a cross-sectional view of a package structure in accordance with some embodiments.

FIG. 17 illustrates a cross-sectional view of a package structure in accordance with some embodiments. The embodiment in FIG. 16 is similar to the embodiment in FIGS. 1 through 15 except that FIG. 17 includes a cover structure 132 over the entire package structure and adhered to the die 68, dies 88, and dummy dies 106. The adhesive 130 and the cover structure 132 may be made of similar materials as the adhesive and cover structure described above in the prior embodiment. Details of this embodiment that are the same or similar to the prior embodiment are not repeated herein.

In FIG. 17, the cover structure 132 is adhered by an adhesive 130 to the underlying components. In some embodiments, the cover structures 132 are placed after encapsulant 112 is formed. Although not shown the cover structures 110 can be included on the dies 88 with the cover structure 132 overlying the cover structures 110 and the other components of the package. In some embodiments, the cover structure 132 is wafer sized and one cover structure is placed over all of regions of the wafer (e.g. 90, 92, etc.) and is singulated to form individual cover structures 132 in each of the package structure regions. In other embodiments, individual cover structures 132 are placed over each of the regions of the wafer (e.g. 90, 92, etc.) before singulation.

Figure 18:
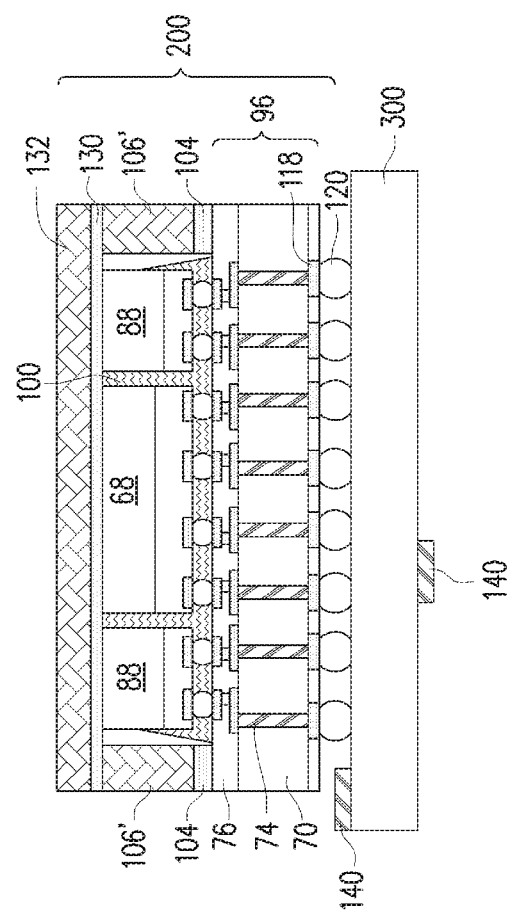
FIG. 18 illustrates a cross-sectional view of a package structure in accordance with some embodiments.

FIG. 18 illustrates a cross-sectional view of a package structure in accordance with some embodiments. The embodiment in FIG. 18 is similar to the embodiment in FIG. 17 except that FIG. 18 does not include encapsulant 112. The dummy dies 106 and cover structure 132 may provide sufficient stress reduction and protection such that the encapsulant can be omitted. Details of this embodiment that are the same or similar to the prior embodiment are not repeated herein.

Figure 19:
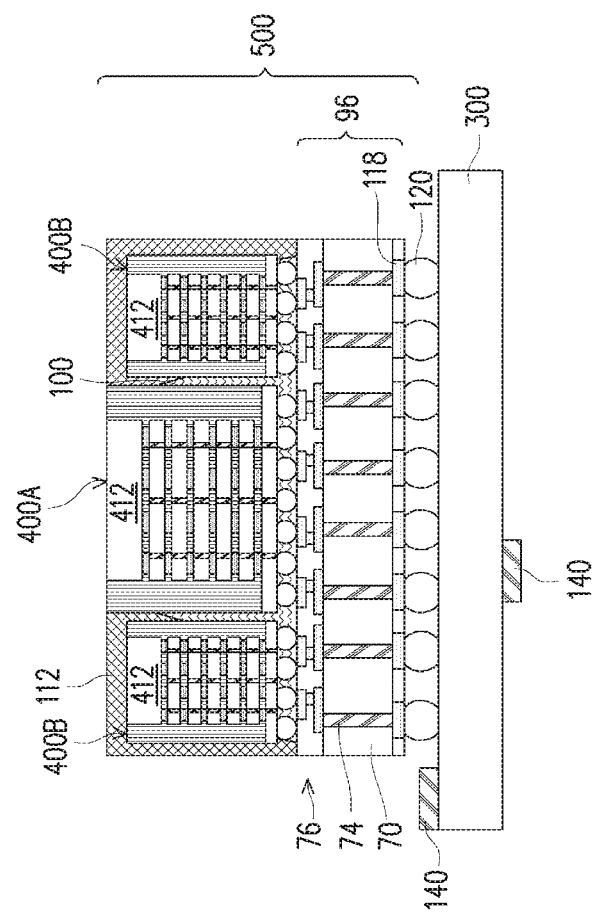
FIGS. 19 and 20 illustrate cross-sectional views of a package structure in accordance with some embodiments.

FIG. 19 illustrates a cross-sectional view of a package structure in accordance with some embodiments. The embodiment in FIG. 19 is similar to the embodiment in FIGS. 1 through 15 except that the package structure 500 in FIG. 19 includes dies 400A and 400B and does not include dummy dies. Details of this embodiment that are the same or similar to the prior embodiment are not repeated herein.

The die 400A may be a logic die (e.g., central processing unit, graphics processing unit, system-on-a-chip, microcontroller, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. The die 400A can include one or more logic dies. The die 400A may be placed and bonded on the component 96 similar to the dies 68 described above and the description is not repeated herein.

The dies 400B may be memory dies, such as DRAM dies, SRAM dies, High-Bandwidth Memory (HBM) dies, Hybrid Memory Cubes (HMC) dies, or the like. In the some embodiments, a die 400B can include both memory dies and a memory controller, such as, for example, a stack of four or eight memory dies with a memory controller. The dies 400B may be placed and bonded on the component 96 similar to the dies 88 described above and the description is not repeated herein.

Figure 20:
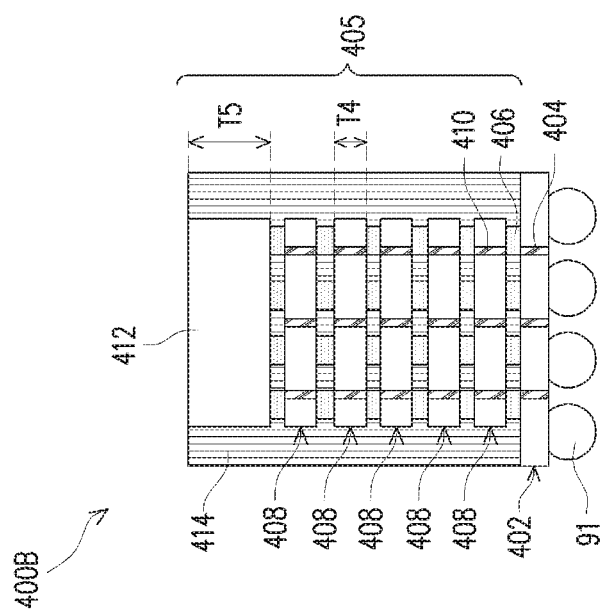

An exemplary die 400B, in accordance with some embodiments, is depicted in greater detail in FIG. 20. Main body 405 may include a plurality of stacked memory dies 408 and a top die 412. The stacked memory dies 408 may all be identical dies, or memory dies 408 may include dies of different types and/or structures. Each memory die 408 is connected to an overlying memory die 408 and/or an underlying memory die 407 by a connector 406. The connectors 406 can be micro bumps or other suitable connectors. The memory dies 408 may include through vias 410 that connect underlying connectors 406 to overlying connectors 406. In some embodiment, the memory dies 408 each have a thickness T4 in a range from about 20 μm to about 100 μm, such as about 60 μm.

In some embodiments, the main body 405 may include HBM (high bandwidth memory) and/or HMC (high memory cube) modules, which may include one or more memory dies 408 connected to a logic die 402. The logic die 402 may include through vias 404 that connect a conductive feature of an interconnection region (not shown) to an overlying connector 406 and memory dies 408. In some embodiments, the logic die 402 may be a memory controller. The interconnection region (not shown) may provide a conductive pattern that allows a pin-out contact pattern for main body 405 that is different than the pattern of conductive joints 91, allowing for greater flexibility in the placement of conductive joints 91. The conductive joints 91 may be disposed on a bottom side of dies 400B, and may be used to physically and electrically connect dies 400B to the component 96. The conductive joints 91 may be electrically connected to the logic die 402 and/or the stacked memory dies 408 by the interconnection region. The conductive joints 91 may be formed using methods that are the same or similar to the methods described above for the conductive joints 91 and the description is not repeated herein.

The top die 412 may be a similar die (in function and circuitry) to the memory dies 408 except that the top die 412 is thicker than the memory dies 408. In some embodiments, the top die 412 is a dummy die and is similar to the cover structures 110 described above. In some embodiments, the top die 412 has a thickness T5 in a range from about 50 μm to about 200 μm, such as about 150 μm. In some embodiments, the top die 412 has a thickness T5 greater than about 120 μm. It has been found that have a top die 412 of the die 400B with a thickness greater than about 120 μm increases the yield of the package structure 500 without requiring the dummy dies 106 and cover structures 110 and 132 of the previous embodiments.

As illustrated by FIG. 20, the main body 405 may be encapsulated in a molding material 414. Molding material 414 may include a molding compound, a molding underfill, an epoxy, or a resin.

Although FIG. 20 illustrates a die 400B with memory dies, the logic die 400A of FIG. 19 could have a similar stacked structure with a thicker top die 412.

Figure 21:
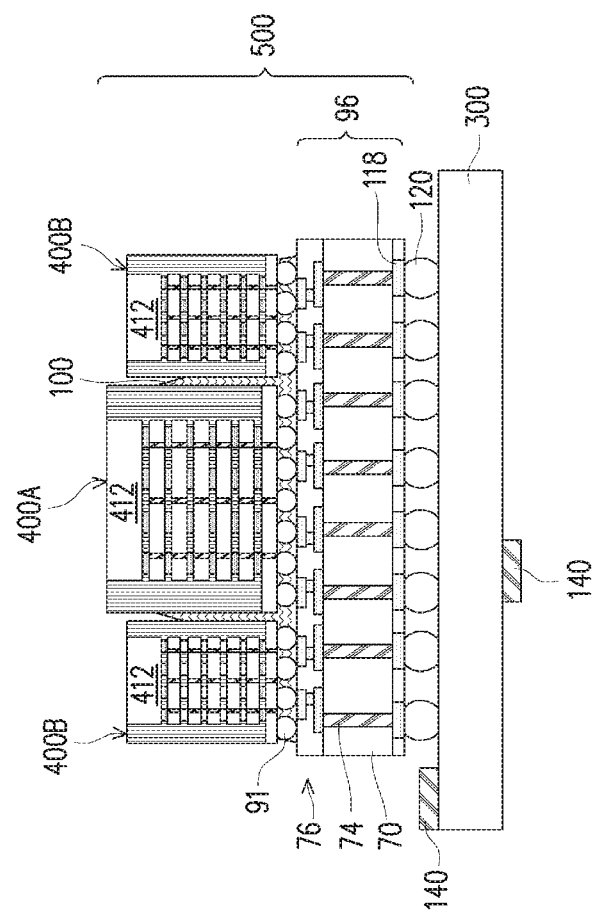
FIG. 21 illustrates a cross-sectional view of a package structure in accordance with some embodiments.

FIG. 21 illustrates a cross-sectional view of a package structure in accordance with some embodiments. The embodiment in FIG. 21 is similar to the embodiment in FIGS. 19 and 20 except that the package structure in FIG. 21 does not include the encapsulant 112. Details of this embodiment that are the same or similar to the prior embodiment are not repeated herein.

The disclosed embodiments of a package structure including dummy die structures adjacent active dies to reduce the warpage of the package structure. This reduction of the warpage of the package structure enables a more reliable package structure by reducing the likelihood of cold joints between the active dies and the interposer. In some embodiments, the dummy dies are in the scribe line regions and cover structures are covering some of the active dies while other active dies are not covered by cover structures. The dummy dies may allow for more control of the ratio of the encapsulant and thus may reduce the stress and warpage from the coefficient of thermal expansion (CTE) mismatch. In some embodiments, the encapsulant can be omitted as the dummy dies in the scribe line regions and/or the cover structures provide sufficient support and protection for the package structure. In some embodiments, the active dies are stacks of one or more dies (logic die stacks and/or memory die stacks) with the topmost die of the die stacks being thicker than the other dies of the die stacks. In these embodiments, the dummy dies in the scribe line regions and the encapsulant can be omitted as thicker top dies of the die stacks provide sufficient support and protection for the package structure.

An embodiment is a method including: attaching a first die to a first side of a first component using first electrical connectors, attaching a first side of a second die to first side of the first component using second electrical connectors, attaching a dummy die to the first side of the first component in a scribe line region of the first component, adhering a cover structure to a second side of the second die, and singulating the first component and the dummy die to form a package structure.

Implementations may include one or more of the following features. The method where the first component is a third die. The method further including: mounting the package structure to a second substrate, the first component being interposed between the first and second dies and the second substrate. The method where singulating includes sawing through the first component and the dummy die to form the package structure. The method where the first component is a bulk substrate including a redistribution structure, the first and second dies being attached to the redistribution structure. The method where the first die includes one or more logic dies, and where the second die includes one or more memory dies. The method further including: forming through vias extending through the first component, the first and second dies being electrically coupled to the through vias; forming third electrical connectors on a second side of the first component, the second side being opposite the first side, the third electrical connectors being electrically coupled to the through vias; mounting the package structure to a second substrate using the third electrical connectors; and bonding a surface mount device (SMD) to the second substrate. The method where the dummy die and the cover structure are made of silicon.

An embodiment is a method including: bonding a first die to a first side of a first structure using first electrical connectors; bonding a memory die to the first side of the first structure using second electrical connectors, the memory die being adjacent the first die; attaching a second die to a back side of the memory die, the second die having a thickness greater than a thickness of the memory die; and singulating the first structure to form a package structure.

Implementations may include one or more of the following features. The method where a thickness of the second die is greater than or equal to 120 m. The method where attaching the second die to the back side of the memory die includes bonding the second die to the back side of the memory die, the second die being a memory die that is electrically coupled to the memory die. The method where attaching the second die to the back side of the memory die includes adhering the second die to the back side of the memory die with an adhesive layer, the second die being made of a bulk material and not including any active or passive devices. The method further including: forming an underfill between the first side of the first structure and the first die and the memory die and surrounding the first electrical connectors and the second electrical connectors; and encapsulating the first die and the memory die with an encapsulant, the encapsulant adjoining portions of the underfill. The method further including: adhering a plurality of dummy dies to the first side of the first structure in scribe line regions of the first structure, where singulating the first structure to form the plurality of package structures includes singulating the plurality of dummy dies. The method further including: before bonding the first die to a first side of a first structure, forming through vias in the first structure; forming a first redistribution structure on the through vias, the first redistribution structure being the first side of the first structure, the first redistribution structure being electrically coupled to the through vias; thinning a second side of the first structure to expose ends of the through vias, the second side being opposite the first side; forming a second redistribution structure on the second side of the first structure thereby forming a first interposer, the second redistribution structure being electrically coupled to the exposed ends of the through vias; forming third electrical connectors on and electrically coupled to the first redistribution structure; bonding the third electrical connectors to a first substrate; and bonding a surface mount device (SMD) to the first substrate adjacent one of the third electrical connectors.

An embodiment is a structure including: a first side of an interposer bonded to a package substrate; active sides of a first die and a second die bonded to a second side of the interposer, the second side being opposite the first side; a dummy die attached to the second side of the interposer, the dummy die being adjacent to at least one of the first die or the second die; and a cover structure adhered to backside of the second die.

Implementations may include one or more of the following features. The structure where the dummy die is made of silicon. The structure where the second die includes one or more memory dies, the cover structure being thicker than each of the one or more memory dies. The structure where cover structure is further adhered to a back side of the first die and to a top surface of the dummy die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
bonding a first die to a first side of an interposer, the interposer comprising a semiconductor substrate;
attaching a dummy die to the first side of the interposer, the dummy die being adjacent to the first die;
attaching a cover structure to backsides of the dummy die and the first die; and
bonding a package substrate to a second side of the interposer, the second side being opposite the first side.

2. The method of claim 1, wherein the dummy die is made of silicon.

3. The method of claim 1 further comprising:
bonding a second die to the first side of the interposer, the second die comprising one or more memory dies, the cover structure being thicker than each of the one or more memory dies.

4. The method of claim 3, wherein the cover structure is attached back sides of the first die, the second die, and the dummy die.

5. The method of claim 3, wherein the first side of the interposer further comprises a redistribution structure on the semiconductor substrate of the interposer, the first die and the second die being bonded to the redistribution structure.

6. The method of claim 5, wherein the interposer further comprises through vias extending through the semiconductor substrate of the interposer, the through vias being electrically coupled to the redistribution structure.

7. The method of claim 6, wherein the second side of the interposer is bonded to package substrate by conductive connectors, the conductive connectors being electrically coupled to the through vias.

8. The method of claim 1 further comprising:
bonding a surface mount device bonded to the package substrate.

9. The method of claim 1, wherein the first die comprises one or more logic dies.

10. The method of claim 1 further comprising:
bonding a second die to the first side of the interposer, the second die comprising one or more memory dies; and
forming an underfill between the first die and the first side of the interposer and the second die and the first side of the interposer.

11. The method of claim 10 further comprising:
forming an encapsulant adjacent the second die, the encapsulant contacting a sidewall of the second die and a sidewall of the underfill.

12. A method comprising:
bonding a first die to a first side of a first interposer;
bonding a stack of memory dies to the first side of the first interposer, the stack of memory dies comprising a top die, the top die being the furthest die in the stack of memory dies from the first side of the first interposer, the top die having a thickness greater than a thickness of each of the other dies in the stack of memory dies, the top die being a memory die; and
bonding a package substrate to a second side of the first interposer, the second side being opposite the first side.

13. The method of claim 12, wherein the top die has a thickness greater than or equal to 120 µm.

14. The method of claim 12 further comprising:
forming an underfill between the first die and the first interposer and the stack of memory dies and the first interposer.

15. The method of claim 14 further comprising:
forming an encapsulant on the underfill between the first die and the stack of memory dies.

16. The method of claim 12, wherein the first interposer comprises a substrate through vias extending through the substrate, the first die being electrically coupled to the through vias.

17. A structure comprising:
a first die bonded to a first side of a first substrate using first electrical connectors;
a dummy die attached to the first side of the first substrate in a scribe line region of the first substrate;
a cover structure attached to a backside of the first die;
an underfill between the first die and the first side of the first substrate, the underfill surrounding the first electrical connectors; and
an encapsulant on the first substrate, the underfill, and the cover structure and on sidewalls of the first die and the dummy die.

18. The structure of claim 17, wherein the dummy die is made of silicon.

19. The structure of claim 17, wherein the cover structure is attached to the backsides of the dummy die and the first die by an adhesive layer.

20. The structure of claim 17, wherein backside surfaces of the first die and the dummy die are at a same level.

* * * * *